US006911155B2

(12) United States Patent
Miller et al.

(10) Patent No.: US 6,911,155 B2
(45) Date of Patent: *Jun. 28, 2005

(54) METHODS AND SYSTEMS FOR FORMING SLOTS IN A SUBSTRATE

(75) Inventors: Michael D. Miller, Pnilomath, OR (US); Michael Hager, Corvalis, OR (US); Naoto A. Kawamura, Corvallis, OR (US); Roberto A. Pugliese, Jr., Tangent, OR (US); Ronald L. Enck, Corvallis, OR (US); Susanne L. Kumpf, Corvallis, OR (US); Shen Buswell, Monmouth, OR (US); Mehrgan Khavari, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 123 days.

This patent is subject to a terminal disclaimer.

(21) Appl. No.: 10/061,836

(22) Filed: Jan. 31, 2002

(65) Prior Publication Data

US 2003/0141279 A1 Jul. 31, 2003

(51) Int. Cl.$^{7}$ .............................. H01L 21/00; B41J 2/04

(52) U.S. Cl. .............................. 216/17; 216/27; 216/58; 216/65; 216/67; 219/161.69

(58) Field of Search .............................. 216/17, 27, 58, 216/65, 67; 219/121.69; 347/65, 54; 438/21

(56) References Cited

U.S. PATENT DOCUMENTS

| | | | | | |
|---|---|---|---|---|---|
| 4,516,315 | A | * | 5/1985 | Przybysz et al. | 438/140 |
| 4,721,977 | A | | 1/1988 | Fukae | |
| 4,746,935 | A | | 5/1988 | Allen | |
| 4,887,100 | A | | 12/1989 | Michaelis et al. | |
| 5,081,063 | A | | 1/1992 | Vonno et al. | |
| 5,160,403 | A | | 11/1992 | Fisher et al. | |
| 5,266,528 | A | | 11/1993 | Yamada | |
| 5,369,060 | A | | 11/1994 | Baumann et al. | |
| 5,387,314 | A | | 2/1995 | Baughman et al. | |
| 5,391,236 | A | * | 2/1995 | Krut et al. | 136/249 |
| 5,408,739 | A | | 4/1995 | Altavela et al. | |
| 5,441,593 | A | | 8/1995 | Baughman et al. | |
| 5,455,998 | A | | 10/1995 | Miyazono et al. | |
| 5,578,418 | A | | 11/1996 | Noguchi et al. | |
| 5,658,471 | A | | 8/1997 | Murthy et al. | |
| 5,678,290 | A | | 10/1997 | Good | |
| 5,818,481 | A | | 10/1998 | Hotomi et al. | |
| 5,825,076 | A | * | 10/1998 | Kotvas et al. | 257/622 |
| 5,998,234 | A | | 12/1999 | Murata et al. | |
| 6,041,501 | A | | 3/2000 | Suzuki et al. | |

(Continued)

FOREIGN PATENT DOCUMENTS

| | | | | | |
|---|---|---|---|---|---|
| EP | 0764533 | | | 3/1997 | |
| EP | 0609012 | B1 | | 5/1997 | |
| EP | 0430593 | B1 | | 6/1999 | |
| EP | 1138491 | A2 | | 10/2001 | |
| JP | 11-198387 | | * | 7/1999 | B41J/2/16 |
| JP | 110198387 | A | | 7/1999 | |

OTHER PUBLICATIONS

British Patent Office Search ReportUnder Section 17—GB0301949.4.

*Primary Examiner*—Shamim Ahmed

(57) ABSTRACT

The described embodiments relate to methods and systems for forming slots in a substrate. In one exemplary embodiment, a slot is formed in a substrate that has first and second opposing surfaces. A first trench is dry etched through the first surface of the substrate. A second trench is created through the second surface of the substrate effective to form, in combination with the first trench, a slot. At least a portion of the slot passes entirely through the substrate, and the maximum width of the slot is less than or equal to about 50 of the thickness of the substrate.

17 Claims, 7 Drawing Sheets

U.S. PATENT DOCUMENTS

| | | | | | |
|---|---|---|---|---|---|
| 6,074,048 | A | | 6/2000 | Hotomi et al. | |
| 6,113,225 | A | * | 9/2000 | Miyata et al. | 347/70 |
| 6,117,347 | A | | 9/2000 | Ishida | |
| 6,139,132 | A | * | 10/2000 | Yasukawa et al. | 347/70 |
| 6,143,190 | A | * | 11/2000 | Yagi et al. | 216/27 |
| 6,238,269 | B1 | | 5/2001 | Pollard et al. | |
| 6,241,335 | B1 | | 6/2001 | Suzuki | |
| 6,267,904 | B1 | * | 7/2001 | Silverbrook | 216/27 |
| 6,271,102 | B1 | | 8/2001 | Brouillette et al. | |
| 6,286,938 | B1 | | 9/2001 | Okano et al. | |
| 6,291,317 | B1 | | 9/2001 | Salatino et al. | |
| 6,312,612 | B1 | * | 11/2001 | Sherman et al. | 216/2 |
| 6,318,844 | B1 | | 11/2001 | Witteveen et al. | |
| 6,338,284 | B1 | * | 1/2002 | Najafi et al. | 73/866.1 |
| 6,342,401 | B1 | * | 1/2002 | Tom | 438/17 |
| 6,467,876 | B1 | * | 10/2002 | Karasawa et al. | 347/45 |
| 2003/0140497 | A1 | * | 7/2003 | Rivas et al. | 29/890.1 |

* cited by examiner

METHODS AND SYSTEMS FOR FORMING SLOTS IN A SUBSTRATE

BACKGROUND OF THE INVENTION

Ink jet printers have become ubiquitous in society. These printers provide many desirable characteristics at an affordable price. However, the desire for ever more features at ever-lower prices continues to press manufacturers to improve efficiencies. Consumers want ever higher print image resolution, realistic colors, and increased pages or printing per minute. One way of achieving consumer demands is by improving the print head and its method of manufacture. Currently, the print head is time consuming and costly to make.

Accordingly, the present invention arose out of a desire to provide fast and economical methods for forming print heads and other fluid ejecting devices having desirable characteristics.

BRIEF DESCRIPTION OF THE DRAWINGS

The same components are used throughout the drawings to reference like features and components.

DETAILED DESCRIPTION OF THE PREFERRED EMBODIMENTS

Overview

The embodiments described below pertain to methods and systems for forming slots in a semiconductor substrate. One embodiment of this process will be described in the context of forming fluid feed slots in a print head die substrate. As commonly used in print head dies, the semiconductor substrate often has microelectronics incorporated within, deposited over, and/or supported by the substrate. The fluid feed slot(s) allow fluid, commonly ink, to be supplied to fluid ejecting elements contained in ejection chambers within the print head. The fluid ejection elements commonly comprise heating elements or firing resistors that heat fluid causing increased pressure in the ejection chamber. A portion of that fluid can be ejected through a firing nozzle with the ejected fluid being replaced by fluid from the fluid feed slot.

The fluid feed slot can be made in various ways. In one embodiment material is removed from the substrate by dry etching a trench through a first substrate surface. A second trench can be formed by various techniques, such as sand drilling, so that the first and second trenches meet to form a slot through the substrate. In some embodiments, the trenches are formed so that they are about equal depth to ensure that they meet at about the middle of the substrate's thickness. Slots made this way can be very narrow and as long as desired. Narrow slots remove less material and have beneficial strength characteristics that can reduce die fragility. This, in turn, can allow slots to be positioned closer together on the die.

Other embodiments include features that reduce the accumulation of bubbles in the slot. Bubbles can result from the fluid ejection process and can occlude fluid feed if they accumulate in the slot. Various techniques can be utilized to promote bubble migration away from the thin film surface where they are most prone to blocking fluid flow.

Although exemplary embodiments described herein are described in the context of providing dies for use in inkjet printers, it is recognized and understood that the techniques described herein can be applicable to other applications where slots are desired to be formed in a substrate.

The various components described below may not be illustrated accurately as far as their size is concerned. Rather, the included figures are intended as diagrammatic representations to illustrate to the reader various inventive principles that are described herein.

Exemplary Printer System

Figure 1:
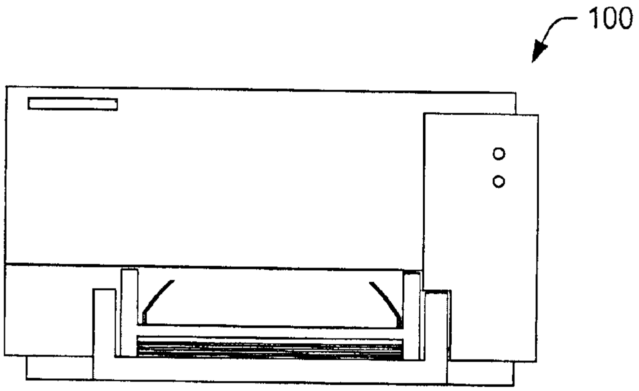
FIG. 1 is a front elevational view of an exemplary printer.

FIG. 1 shows one embodiment of a printer 100, embodied in the form of an inkjet printer. The printer 100 can be, but need not be, representative of an inkjet printer series manufactured by the Hewlett-Packard Company under the trademark "DeskJet". The inkjet printer 100 is capable of printing in black-and-white and/or in color. The term "printer" refers to any type of printer or printing device that ejects fluid or other pigmented materials onto a print media. Though an inkjet printer is shown for exemplary purposes, it is noted that aspects of the described embodiments can be implemented in other forms of printing devices that employ inkjet printing elements or other fluid ejecting devices, such as facsimile machines, photocopiers, and the like.

Figure 2:
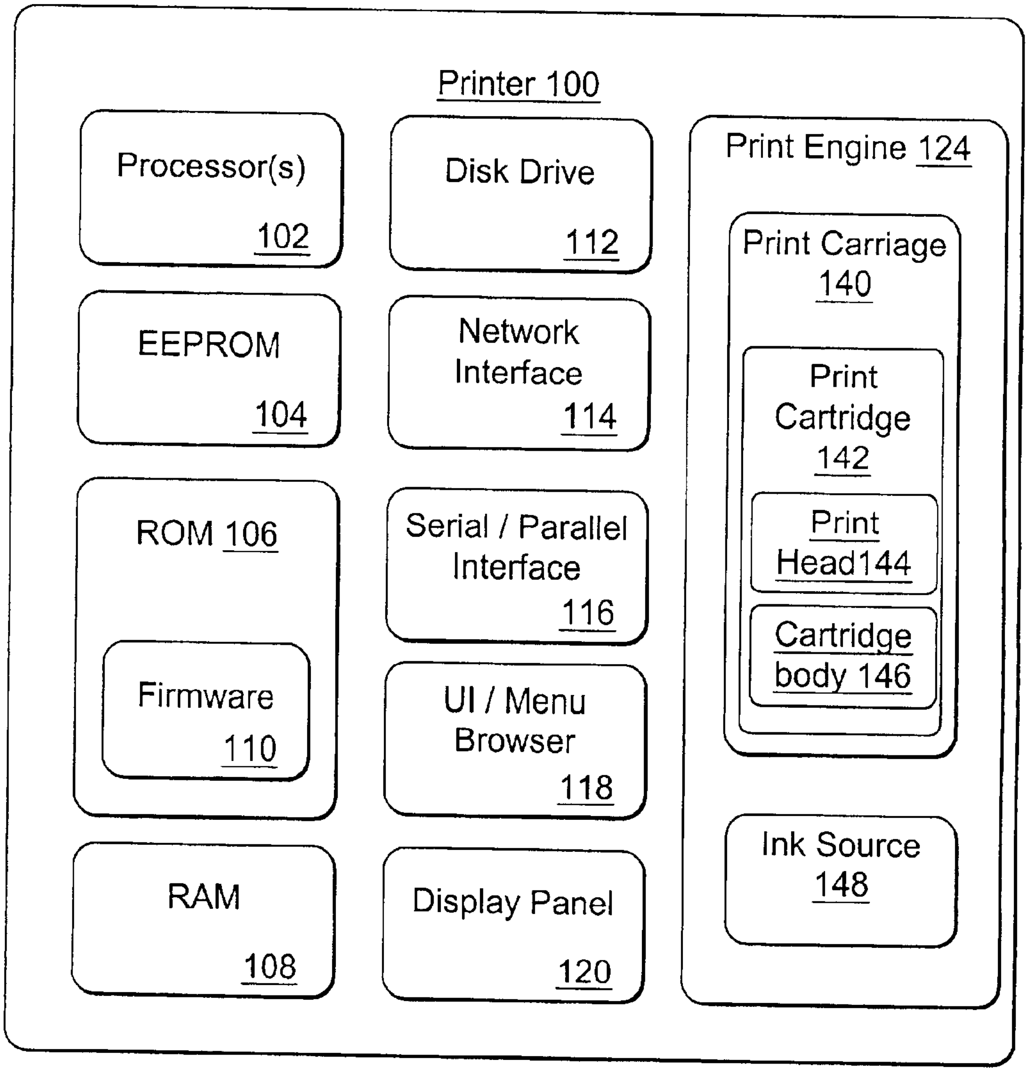
FIG. 2 is a block diagram that illustrates various components of an exemplary printer.

FIG. 2 illustrates various components in one embodiment of printer 100 that can be utilized to implement the inventive techniques described herein. Printer 100 can include one or more processors 102. The processor 102 controls various printer operations, such as media handling and carriage movement for linear positioning of the print head over a print media (e.g., paper, transparency, etc.).

Printer 100 can have an electrically erasable programmable read-only memory (EEPROM) 104, ROM 106 (non-erasable), and/or a random access memory (RAM) 108. Although printer 100 is illustrated having an EEPROM 104 and ROM 106, a particular printer may only include one of the memory components. Additionally, although not shown, a system bus typically connects the various components within the printing device 100.

The printer 100 can also have a firmware component 110 that is implemented as a permanent memory module stored on ROM 106, in one embodiment. The firmware 110 is programmed and tested like software, and is distributed with the printer 100. The firmware 110 can be implemented to coordinate operations of the hardware within printer 100 and contains programming constructs used to perform such operations.

In this embodiment, processor(s) 102 process various instructions to control the operation of the printer 100 and to communicate with other electronic and computing devices. The memory components, EEPROM 104, ROM 106, and RAM 108, store various information and/or data such as configuration information, fonts, templates, data being printed, and menu structure information. Although not shown in this embodiment, a particular printer can also include a flash memory device in place of or in addition to EEPROM 104 and ROM 106.

Printer 100 can also include a disk drive 112, a network interface 114, and a serial/parallel interface 116 as shown in the embodiment of FIG. 2. Disk drive 112 provides additional storage for data being printed or other information maintained by the printer 100. Although printer 100 is illustrated having both RAM 108 and a disk drive 112, a particular printer may include either RAM 108 or disk drive 112, depending on the storage needs of the printer. For example, an inexpensive printer may include a small amount of RAM 108 and no disk drive 112, thereby reducing the manufacturing cost of the printer.

Network interface 114 provides a connection between printer 100 and a data communication network in the embodiment shown. The network interface 114 allows devices coupled to a common data communication network to send print jobs, menu data, and other information to printer 100 via the network. Similarly, serial/parallel interface 116 provides a data communication path directly between printer 100 and another electronic or computing device. Although printer 100 is illustrated having a network interface 114 and serial/parallel interface 116, a particular printer may only include one interface component.

Printer 100 can also include a user interface and menu browser 118, and a display panel 120 as shown in the embodiment of FIG. 2. The user interface and menu browser 118 allows a user of the printer 100 to navigate the printer's menu structure. User interface 118 can be indicators or a series of buttons, switches, or other selectable controls that are manipulated by a user of the printer. Display panel 120 is a graphical display that provides information regarding the status of the printer 100 and the current options available to a user through the menu structure.

This embodiment of printer 100 also includes a print engine 124 that includes mechanisms arranged to selectively apply fluid (e.g., liquid ink) to a print media such as paper, plastic, fabric, and the like in accordance with print data corresponding to a print job.

The print engine 124 can comprise a print carriage 140. The print carriage can contain one or more print cartridges 142 that comprise a print head 144 and a print cartridge body 146. Additionally, the print engine can comprise one or more fluid sources 148 for providing fluid to the print cartridges and ultimately to a print media via the print heads.

Exemplary Embodiments and Methods

Figure 4:
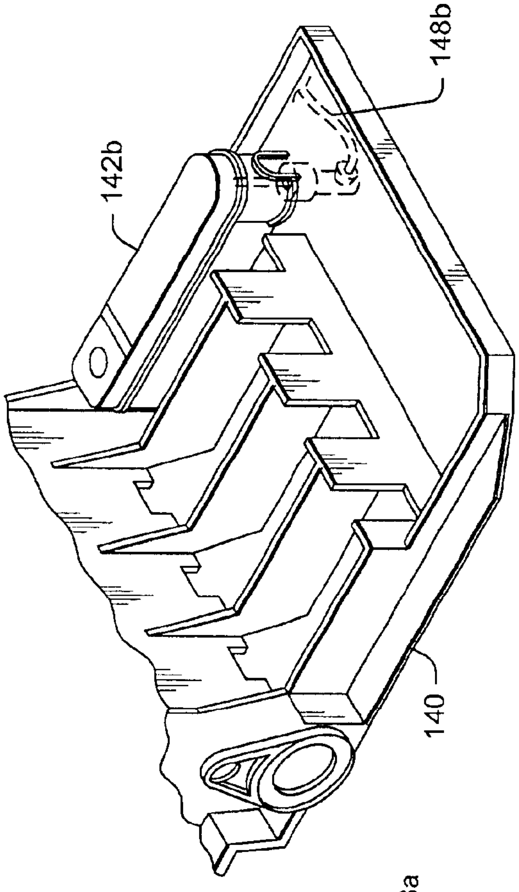
FIGS. 3 and 4 each show a perspective view of a print carriage in accordance with one exemplary embodiment.
Figure 3:
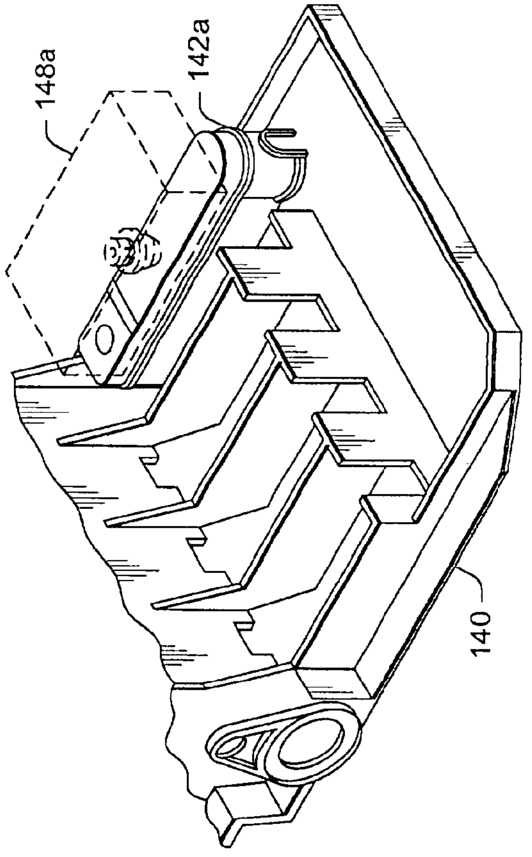

FIGS. 3 and 4 show exemplary print cartridges (142*a* and 142*b*) in a print carriage 140. The print carriages depicted are configured to hold four print cartridges although only one print cartridge is shown. Many other exemplary configurations are possible. FIG. 3 shows the print cartridge 142*a* configured for an up connect to a fluid source 148*a*, while FIG. 4 shows print cartridge 142*b* configured to down connect to a fluid source 148*b*. Other exemplary configurations are possible including but not limited the print cartridge having its own self-contained fluid supply.

Figure 5:
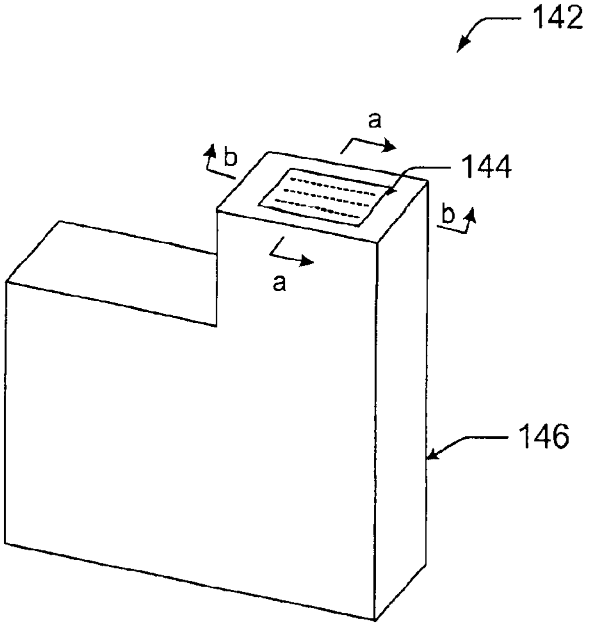
FIG. 5 is a perspective view of a print cartridge in accordance with one exemplary embodiment.

FIG. 5 shows an exemplary print cartridge 142. The print cartridge is comprised of the print head 144 and the cartridge body 146. Other exemplary configurations will be recognized by those of skill in the art.

Figure 6:
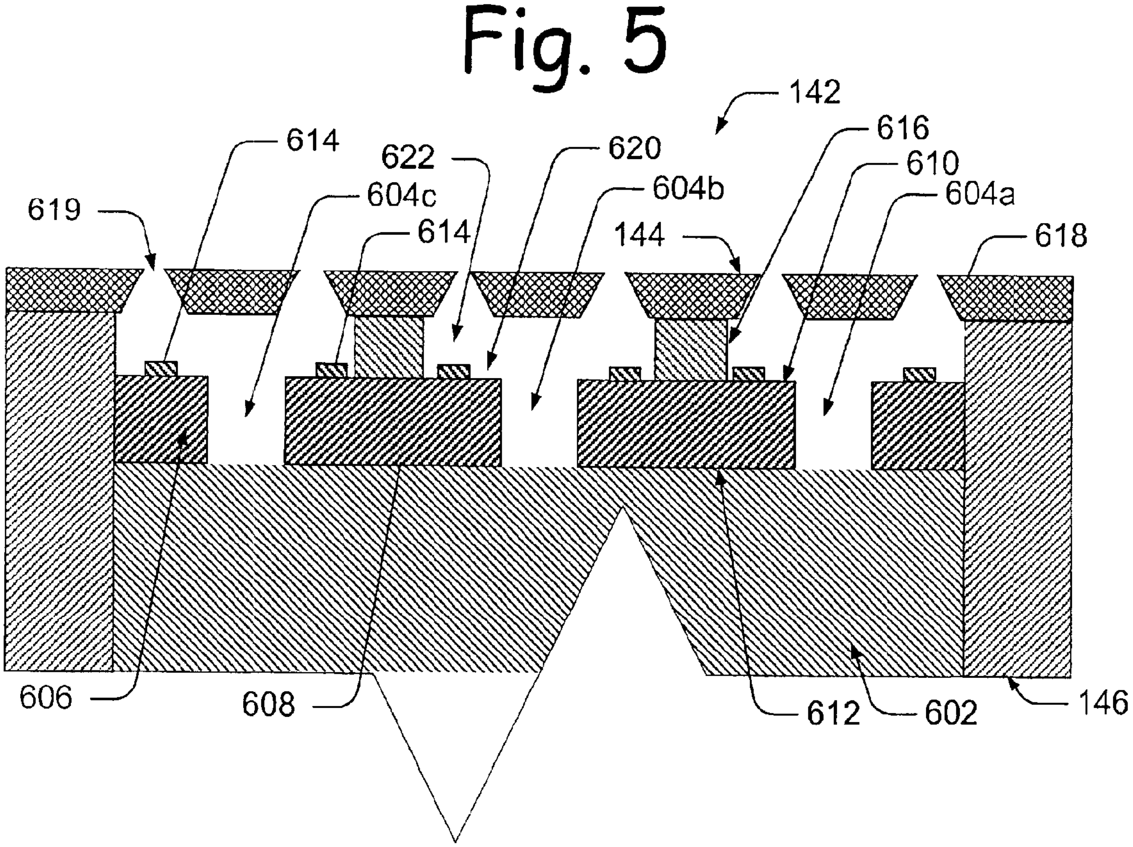
FIG. 6 is a cross-sectional view of a top of a print cartridge in accordance with one exemplary embodiment.

FIG. 6 shows a cross-sectional representation of a portion of the exemplary print cartridge 142 taken along line a—a in FIG. 5. It shows the cartridge body 146 containing fluid 602 for supply to the print head 144. In this embodiment, the print cartridge is configured to supply one color of fluid or ink to the print head. In this embodiment, a number of different fluid feed slots are provided, with three exemplary slots being shown at 604*a*, 604*b*, and 604*c*. Other exemplary embodiments can divide the fluid supply so that each of the three fluid feed slots 604*a*–604*c* receives a separate fluid supply. Other exemplary print heads can utilize less or more slots than the three shown here.

The various fluid feed slots pass through portions of a substrate 606 in this embodiment. Silicon can be a suitable substrate, for this embodiment. In some embodiments, substrate 606 comprises a crystalline substrate such as single crystalline silicon or polycrystalline silicon. Examples of other suitable substrates include, among others, gallium arsenide, glass, silica, ceramics or a semi conducting material. The substrate can comprise various configurations as will be recognized by one of skill in the art. In this exemplary embodiment, the substrate comprises a base layer, shown here as silicon substrate 608. The silicon substrate has a first surface 610 and a second surface 612. Positioned above the silicon substrate are the independently controllable fluid drop generators that in this embodiment comprise firing resistors 614. In this exemplary embodiment, the resistors are part of a stack of thin film layers on top of the silicon substrate 608. The thin film layers can further comprise a barrier layer 616. The barrier layer can comprise, among other things, a photo-resist polymer substrate. Above the barrier layer is an orifice plate 618 that can comprise, but is not limited to a nickel substrate. The orifice plate has a plurality of nozzles 619 through which fluid heated by the various resistors can be ejected for printing on a print media (not shown). The various layers can be formed, deposited, or attached upon the preceding layers. The configuration given here is but one possible configuration. For example, in an alternative embodiment, the orifice plate and barrier layer are integral.

The exemplary print cartridge shown in FIGS. 5 and 6 is upside down from the common orientation during usage. When positioned for use, fluid can flow from the cartridge body 146 into one or more of the slots 604*a*–604*c*. From the slots, the fluid can travel through a fluid feed passageway 620 that leads to a firing chamber 622. A firing chamber can be comprised of a firing resistor, a nozzle, and a given volume of space therein. Other configurations are also possible. When an electrical current is passed through the resistor in a given firing chamber, the fluid can be heated to its boiling point so that it expands to eject a portion of the fluid from the nozzle 619. The ejected fluid can then be replaced by additional fluid from the fluid feed passageway 620.

Figure 7:
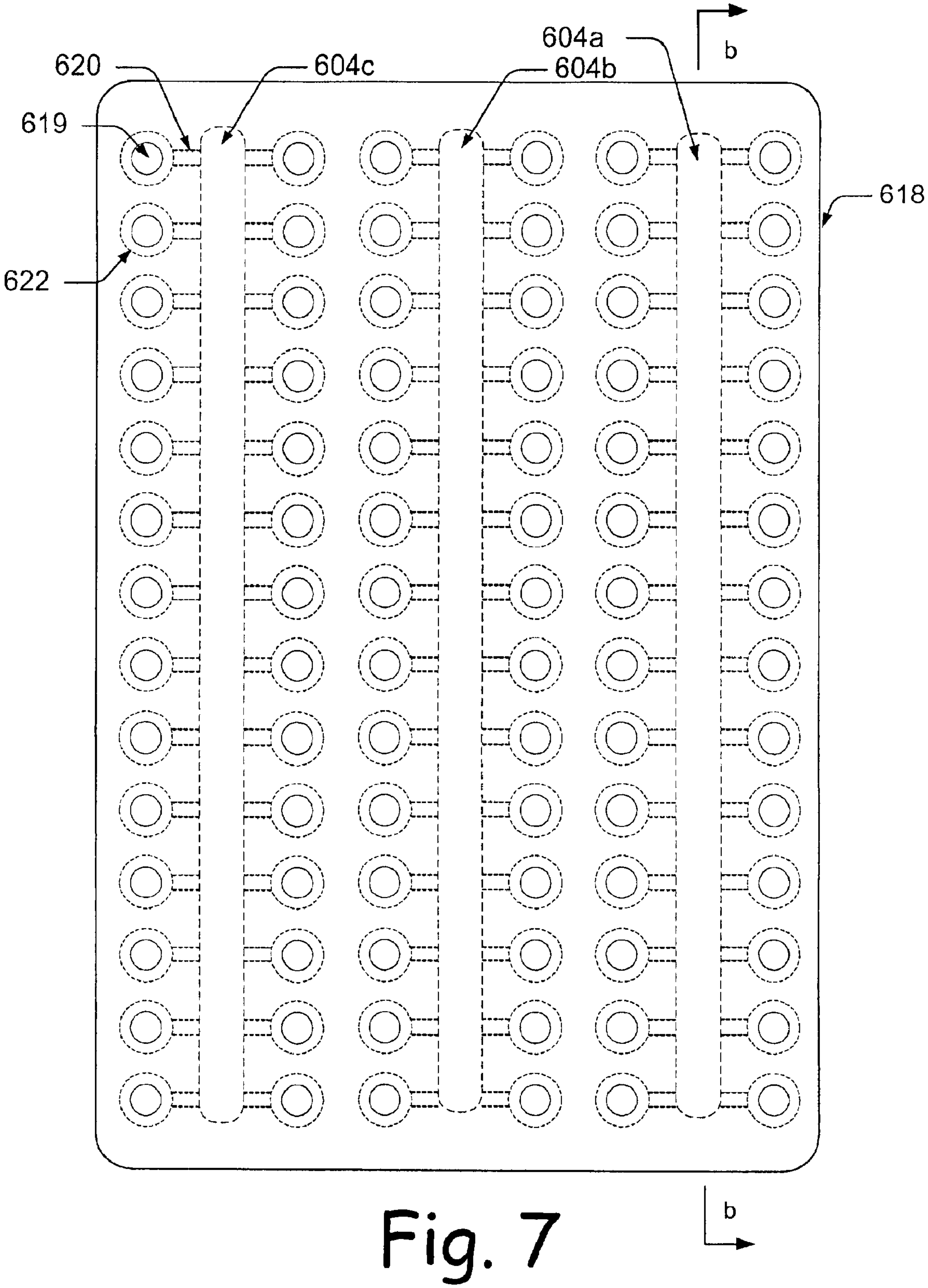
FIG. 7 is a top view of a print head in accordance with one exemplary embodiment.

The embodiment of FIG. 7 shows a view from above the thin-film surface of a substrate incorporated into a print head. The substrate is covered by the orifice plate 618 with underlying structures of the print head indicated in dashed lines in this embodiment. The orifice plate is shown with numerous nozzles 619. Below each nozzle lies the firing chamber 622 that is connected to a fluid feed passageway (feed channel) 620 and then to slot 604*a*–*c*. The slots are illustrated in this embodiment as an elliptical configuration when viewed from above the first surface of the substrate. Other exemplary geometries include rectangular among others.

Exemplary Slot Forming Techniques

FIGS. 8*a*–8*f* and 9*a*–9*j* show two exemplary embodiments, respectively, in which portions of the substrate are removed to form slots through the substrate. The illustrated substrate 606 has a thickness t. The described embodiments can work satisfactorily with various thicknesses of substrate. For example, in the specific described embodiments, the thickness can range from less than about 100 microns to at least about 2000 microns. The thickness of the substrate t in some exemplary embodiments can be about 675 microns.

Figure 8A:
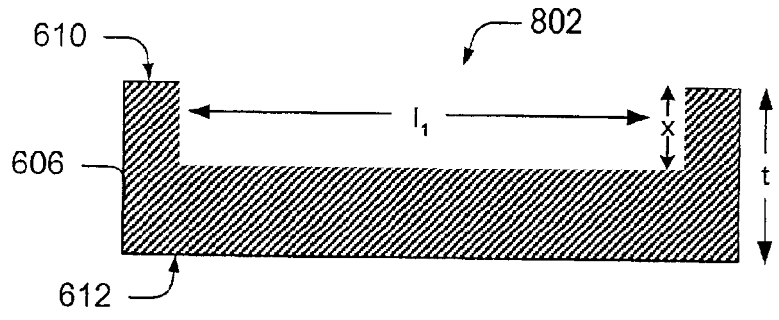
FIGS. 8*a*–8*f* each show a cross-sectional view of a substrate in accordance with one exemplary embodiment.
Figure 8B:
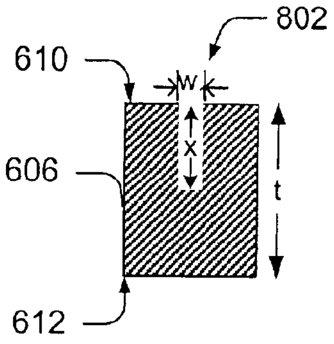

The slots can comprise a first trench 802 that originates from a first side of the substrate, and a second trench 804 (shown FIG. 8*c*) that originates from the second side of the substrate. For ease of appreciating these trenches, the figures are shown in corresponding pairs. For example, FIG. 8*a* is a portion of a cross-section taken along line b—b indicated in FIGS. 5 and 7, and shows a length $l_1$ and depth x of the first trench. FIG. 8*b* is a portion of a cross section taken along line a—a in FIG. 5. FIG. 8*b* shows the width $w_1$ and the same depth x shown in FIG. 8*a* of the first trench 802. FIGS. 8*c* and 8*d* and FIGS. 8*e* and 8*f* have similar relationships.

FIG. 8*a* shows an exemplary embodiment where the first trench 802 has been formed in the substrate from a first side or surface 610. Here, the first surface can comprise the thin film side of the substrate. The trench can be formed by a dry etch process. The dry etch process is an alternating process that can comprise depositing a passivation layer followed by etching. This alternating sequence can be repeated as desired to remove additional substrate. The dry etch can use $SF_6$ in the etch step and $C_4F_8$ in the depositing step, among others.

The trench shown in FIG. 8*a* extends through approximately 50 percent of the substrate as indicated by x, and thus has a depth of about 335 microns in this particular example. In other embodiments, the trench can be any depth from less than about 40 microns to passing through the entire thickness t. More commonly, the depth x of the trench can be from about 25 percent of the thickness of the substrate to about 75 percent of the thickness of the substrate.

Figure 8C:
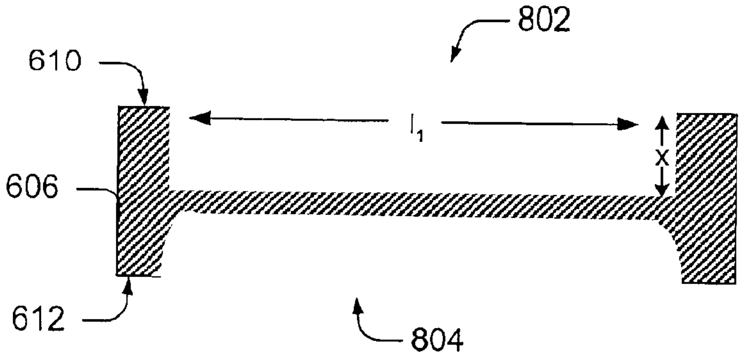
Figure 8D:
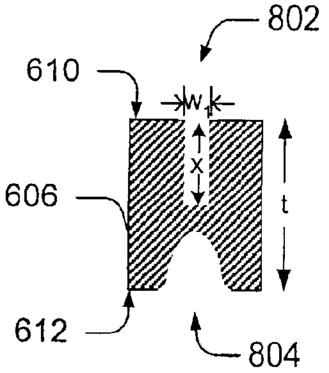

FIG. 8*c* shows a partially completed second trench 804 that is formed from the substrate's second side or surface 612. FIG. 8*d* shows a transverse cross section of the partially completed trench 804. In various embodiments, the second trench can be formed by removing or ablating material through the second surface into the thickness of the substrate. In this example, sand drilling is being used to form the second trench. Sand drilling is a mechanical cutting process where target material is removed by particles such as aluminum oxide delivered from a high pressure air flow system. Sand drilling is also known as sand blasting, abrasive sand machining, and sand abrasion. The sand is removing substrate material until breakthrough occurs between the first trench and the second trench, and then additional substrate material can be removed as desired.

In addition to sand drilling, other exemplary embodiments can remove or ablate substrate material to form the second trench using one or more of the following: laser machining, dry etching, wet etching, and mechanical machining. Mechanical machining can include the use of various saws and drills that are commonly used to remove substrate material.

Figure 8E:
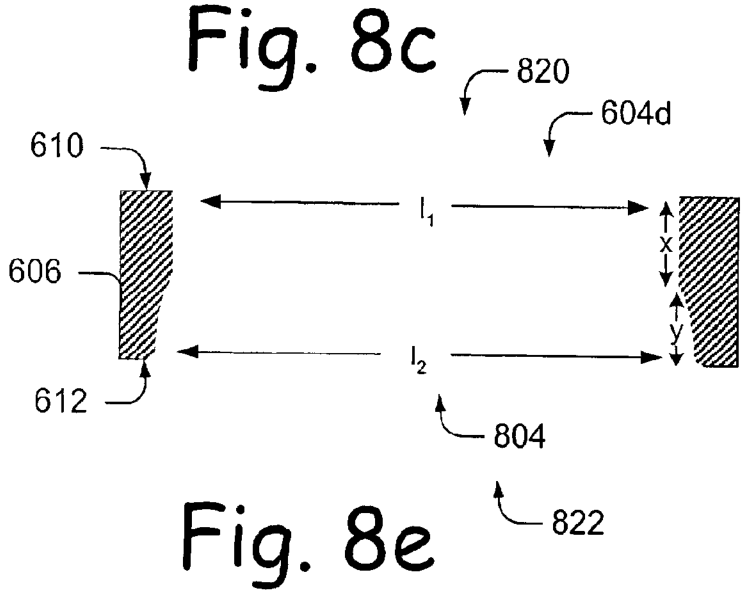
Figure 8F:
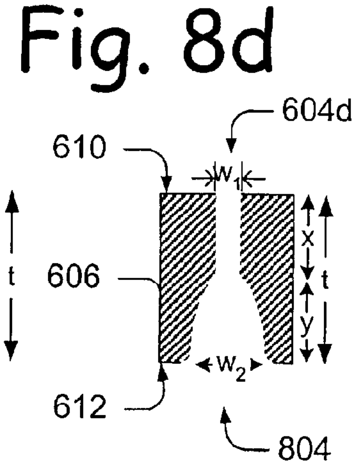

FIGS. 8*e*–8*f* show an embodiment where the first trench 802 has been dry etched generally at 820, and material has been removed to form a second trench 804 generally at 822 to form a slot 604*d*. This embodiment shows the finished second trench 804 having a length $l_2$ and a width $w_2$ and a depth y. The trench intercepts or otherwise joins with a portion of the first trench. The combination of the two trenches forms a slot 604*d* that extends through the thickness of the substrate and through which a fluid such as ink can flow. So for at least a portion of the substrate, the depths (x and y) of the two trenches equal the thickness t.

In the exemplary embodiment shown in FIGS. 8*e*–8*f*, the first trench 802 has generally planar side walls that are generally orthogonal to the first surface 610. The second trench 804 has generally concave side walls. Other embodiments can have various other side wall configurations.

As shown in FIGS. 8*e*–8*f*, in this exemplary embodiment, the second trench intercepts the entire length $l_1$ of the first trench. Other exemplary embodiments can have less than the entirety of the length of the first trench intercepted by the second trench. Additionally, the second trench can be longer than the first trench so that it encompasses a portion of the first trench for its entire length within the second trench.

In the exemplary embodiment shown in FIG. 8*f*, the depth x of the first trench and depth y of the second trench 804 are approximately equal. Other exemplary embodiments can have each trench being shallower or deeper than this embodiment.

Although the described embodiments illustrate only removing material from the substrate, intermediate steps in some satisfactory embodiments can add material to the substrate. For example, a material can be deposited as part of the slot formation sequence.

The dimensions of the trenches can be modified to make a through slot of any desired length and/or width. For example, the length of the slot can be made small enough that it resembles a hole or via.

The process of forming a portion of the slot from each side can provide many desirable advantages. One advantage pertains to the dimensions of the slot width. For example, a greatly reduced slot width can be formed using the techniques describes above, as compared with slot widths that are formed entirely from a single side.

For example, in one embodiment, on a standard 675 micron thick substrate, a first trench can be dry etched through about one-half of the thickness of the substrate from the front side. The remainder of the thickness of the substrate can be removed from the backside by sand drilling. In one embodiment, the maximum width of the slot can be located on the backside surface. This can be seen in the exemplary embodiment shown in FIG. 8*f*, where the width $w_2$ of the second trench 804 can be about 240 microns and the width $w_1$ of the first trench 802 can about 80 microns. This provides a backside trench having a width that is about 300 percent of the width of the front side trench, other embodiments can have larger or smaller relationships. The dimensions described in relation to the embodiment of FIG. 8*f*, provide an aspect ratio (substrate thickness divided by slot width) of about 3. Other embodiments can have other aspect ratios ranging from about 1 to greater than or equal about 20.

Other exemplary embodiments can have a trench width of less than about 350 microns. Viewed another way, in some embodiments, the maximum width of the slot 604 is less than or equal to 50 percent of the thickness of the substrate.

Conversely, forming a slot using sand drilling alone can form a slot having about a 180 micron thin film width and a backside width of about 650 microns. Thus, the maximum slot width is approximately equal to the substrate thickness, for an aspect ratio of about 1. A slot manufactured in this manner removes a large amount of substrate material making the remaining substrate more fragile. Further, the width of the backside trench requires an undesirably large distance between adjacent slots on a multi-slot substrate or die.

Some of the present embodiments, by forming a significant portion of the slot from the front side, not only allow a narrower slot width than sand drilling alone, but can also form a slot of much better quality. For example, a slot that is sand drilled entirely from the backside creates stresses on the underside of the thin film layer before "breakthrough" occurs. Breakthrough is the moment when the entire thickness of a given portion of the substrate has been removed. When breakthrough occurs at the thin film side, large stress forces can weaken the substrate and additionally can cause large chips to be broken from the sides of the slot. This chipping hinders the print quality of the die.

When dry etching is conducted from the first side through a significant portion of the substrate, breakthrough from the backside occurs generally in the middle of the substrate where chipping is both minimized and less critical than on the thin film side/surface. Further, the substrate is less susceptible to stress induced breakage when the breakthrough occurs toward the center of the substrate's thickness.

FIGS. 9*a*–9*j* show another exemplary embodiment. Here, multiple dry etch processes are used from the thin film side 610 to form the first trench 802*a* before the backside trench 804*a* is formed to intercept the front side trench to define the slot 604*d*. Standard dry etch techniques can be utilized as will be recognized by one of skill in the art.

Some exemplary embodiments deposit a masking agent on the substrate and then etch and repeat the process as desired to form a trench. For example, a masking agent such as ep24620 can be used, followed by a dry etchant such as $CF_4$.

Figure 9A:
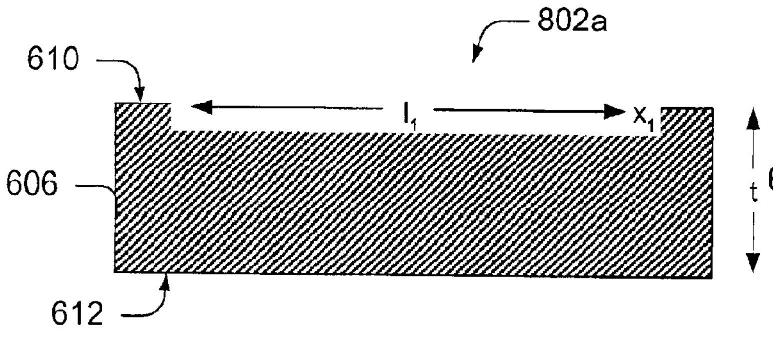
FIGS. 9*a*–9*j* each show a cross-sectional view of a substrate in accordance with one exemplary embodiment.
Figure 9B:
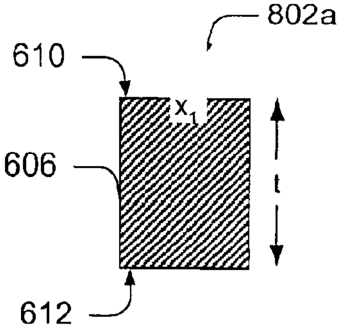
Figure 9C:
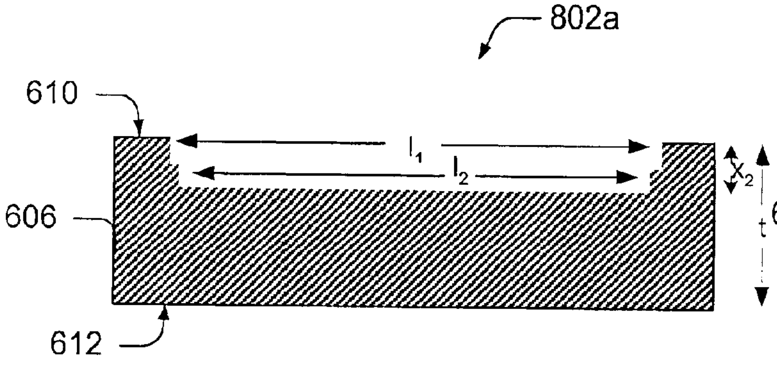
Figure 9D:
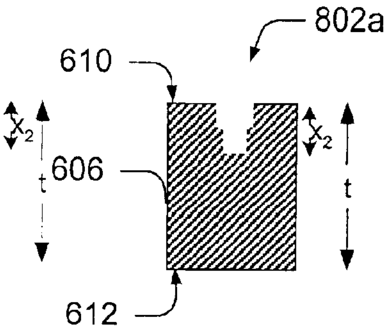

The embodiments of FIGS. 9*a* and 9*b* show part of a first trench 802*a* formed from the thin film side 610 of the substrate 606. A subsequent dry etch process forms the first part of the trench having length $l_1$ and depth $x_1$. In the embodiments of FIG. 9*c*, a subsequent dry etch process forms the second part of the trench having the length $l_2$ which is less than $l_1$ and increases the trench depth to $x_2$. Other embodiments can include multiple etching steps where each etching step covers about the same or greater width and length as the previous one.

Figure 9E:
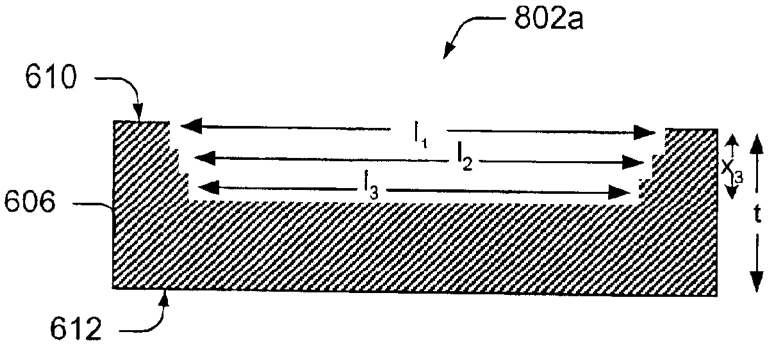
Figure 9F:
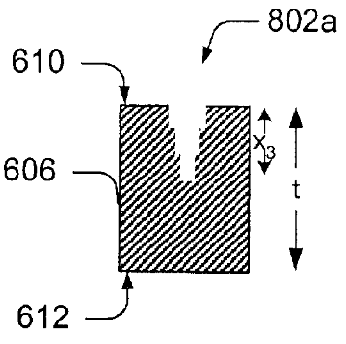

The embodiments shown in FIGS. 9*e*–9*f* show the results of a third dry etch process that creates the deepest portions of the trench. In FIGS. 9*e*–9*f*, the deepest portions of the trench are considered to define the depth $x_3$. As with the second etch, this dry etch resulted in a trench portion having a length $l_3$ that is shorter than the one preceding ($l_2$). These multiple dry etches can create a "stair step" pattern on the walls of the trench 802*a* that can be advantageous and will be discussed in more detail below.

Figure 9G:
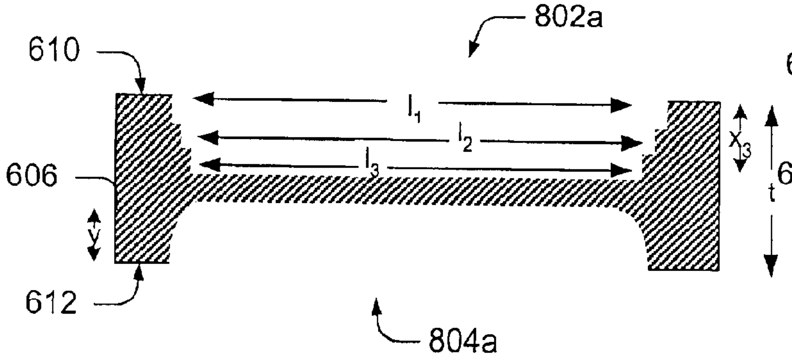
Figure 9H:
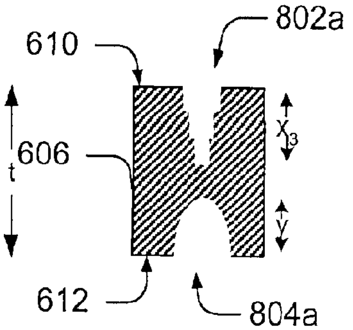

The embodiments of FIGS. 9*g*–9*h* show a second partially formed trench 804*a* from the backside 612 of the substrate 606. In this exemplary embodiment, the second trench 804*a* was formed by sand drilling, though other embodiments can utilize other methods.

Figure 9I:
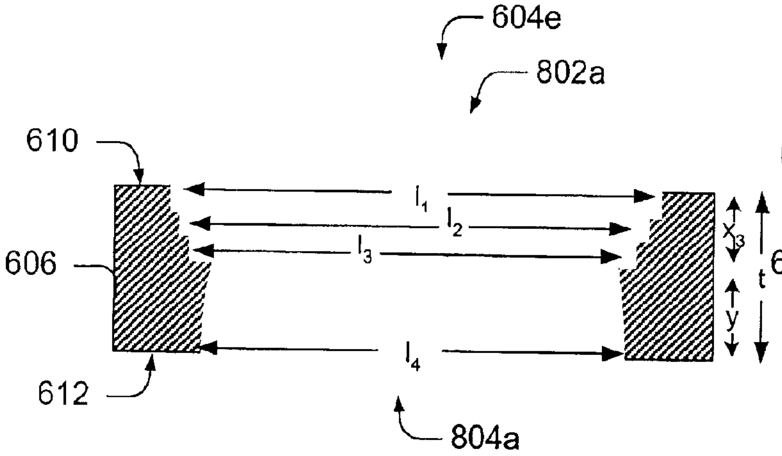
Figure 9J:
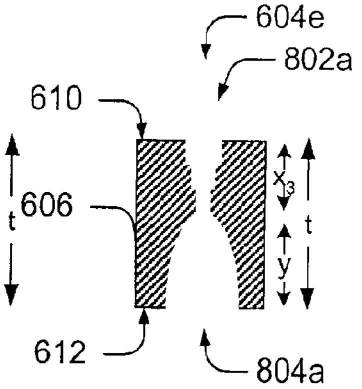

The embodiments of FIGS. 9*i*–9*j* show the completed second trench 804*a*. It can be seen by comparing the length $l_4$ with the length $l_3$ that the backside trench 804*a* intercepts less than the entirety of the length of the front side trench. Such need not, however, be the case. The walls of the second trench in this embodiment are somewhat curved as can be achieved by sand drilling and other methods. Other embodiments can have trenches having different wall shapes from those shown in this embodiment.

As shown in this embodiment, the stair step configuration was achieved by making a shallow dry etch having a relatively large length and width (footprint), followed by subsequent dry etches of progressively smaller footprints. Other embodiments can achieve similar results through other techniques. For example, a first dry etch from a first side having a relatively small footprint can be completed to a desired final depth. This etch can then be incorporated into subsequent etches from the front side that have larger footprints but are shallower in depth. The skilled artisan will recognize other satisfactory embodiments.

The stair step configuration can reduce the amount of silicon removed from the substrate thus increasing die strength and decreasing manufacturing cost and time. Additionally, this configuration can allow the backside trench to be of less length than the front side trench while substantially avoiding bubble build up in the slot.

In some embodiments, gas bubbles can be generated in the fluid ejection process. The bubbles can accumulate in the fluid feed slot or passageways leading to the firing chambers and occlude fluid from reaching some or all of the resistors, thus causing printer failure. Bubbles tend to accumulate on extended horizontal surface instead of migrating up toward the backside surface and into the cartridge body. The stair step configuration can reduce the occurrence of bubble accumulation by reducing areas where bubbles tend to accumulate.

Specifically, recall that, as shown in the embodiments of FIGS. 9*a*–9*j*, the substrate is effectively upside down from the configuration in which it is commonly used. The stair step configuration shown in these embodiments can eliminate broad horizontal surfaces where bubbles tend to accumulate. Specifically, by having multiple narrow shelves, bubbles that tend to form and accumulate are allowed, during the fluid ejection process, to migrate upward into the backside trench away from the thin film side, or otherwise dissipate. The stair step configuration can be utilized on both the width and the length of the slot as shown in previous embodiment, or alternatively the stair step configuration can be on either the width or the length. For example, a common width w can be maintained in the multiple dry etches forming the first trench while the lengths $l_1$, $l_2$, and $l_3$ are made progressively shorter or longer as desired.

In some embodiments, cuts or slots made in the substrate through dry etching can have cleaner side edges with less chipping or variation than other slotting techniques. For example, slots made by dry etching can have sidewalls variations of less than about 5–10 microns, whereas existing sand drilling technology can create chips in excess of about 45–50 microns. This feature of this embodiment, in addition to the increased substrate strength and higher aspect ratio, can further allow slots to be placed closer together on the substrate than existing technologies.

The illustrated embodiments describe the first trench being constructed using dry etching followed by various other removal techniques forming the second trench. In other exemplary embodiments, the act of dry etching(s) can be performed after the other act(s) of removal of the substrate. Other exemplary embodiments also can have other intermediary steps.

CONCLUSION

The described embodiments can provide methods and systems for forming slots in a semiconductor substrate. The slots can be formed by dry etching from a first surface and removing material through the use of various techniques from the other surface. The slots can be inexpensive and quick to form. They can be made as long as desirable and have higher aspect ratios than existing technologies. The resultant substrate can have beneficial strength characteristics that can reduce die fragility and allow slots to be positioned closer together on the die.

Although the invention has been described in language specific to structural features and methodological steps, it is to be understood that the invention defined in the appended claims is not necessarily limited to the specific features or steps described. Rather, the specific features and steps are disclosed as preferred forms of implementing the claimed invention.

What is claimed is:

1. A method of fabricating a slot in a print head substrate, comprising:

dry etching through a first surface of the substrate having a thickness between the first and a second opposing surfaces, wherein said dry etching removes about 50 percent of the thickness of the substrate; and, sand drilling through the second surface of the substrate effective to form, in combination with said etching, a slot at least a portion of which passes entirely through the thickness of the substrate, wherein the slot has a maximum slot width measured parallel to the first surface that is less than one half of the thickness.

2. A method of forming fluid handling slots in a semiconductor substrate having a thickness between opposing first and second surfaces comprising:

dry etching into the substrate from the first surface to form a first trench having a trench length and a trench width; and, removing substrate material through the second surface to form a second trench, wherein at least a portion of the first and second trenches intersect to form a slot through the substrate, and wherein the slot has a maximum slot width measured parallel to the first surface that is less than one half of the thickness.

3. The method of claim 2, wherein said removing comprises one or more of: sand drilling, laser machining, dry etching, wet etching, and mechanical drilling.

4. The method of claim 2, wherein said act of dry etching is performed before said act of removing.

5. The method of claim 2, wherein said dry etching comprises multiple acts of dry etching, wherein subsequent individual acts of dry etching remove shorter lengths of substrate than previous individual acts of dry etching.

6. The method of claim 2, wherein the second trench formed by said removing has a maximum second trench width of less than or equal to about 240 microns.

7. The method of claim 2, wherein the second trench formed by said removing has a maximum second trench width of about 50 percent or less the thickness of the substrate.

8. The method of claim 2, wherein the second trench formed by said removing has a length at a region where breakthrough occurs that is approximately equal to the maximum length of the first trench.

9. The method of claim 2, wherein the second trench formed by said removing has a length at a region where breakthrough occurs that is about 25 percent to about 75 percent the length of the first trench where the trenches intersect to form the slot.

10. The method of claim 2, wherein the first trench formed by said dry etching has a depth of about 25 percent to about 75 percent of the thickness of the substrate.

11. The method of claim 2, wherein the second trench formed by said removing has a maximum width of less than or equal to about 300 percent the maximum width of the first trench formed by said dry etching.

12. A method of forming slots in a semiconductor substrate having first and second opposing surfaces comprising:

dry etching a first trench through the first surface of the substrate; and, creating a second trench through the second surface of the substrate effective to form, in combination with the first trench, a slot at least a portion of which passes entirely through the substrate, wherein the maximum width of the slot is less than or equal to about 50 percent of the thickness of the substrate.

13. The method of claim 12, wherein said creating a second trench comprises sand drilling.

14. The method of claim 12, wherein said creating a second trench comprises wet etching, dry etching, mechanical drilling, or laser machining.

15. The method of claim 12, wherein said dry etching comprises dry etching into a thin film side.

16. The method of claim 12, wherein said dry etching and said creating form a slot having a configuration that reduces bubble accumulation.

17. The method of claim 12, wherein said act of dry etching is performed prior to said act of creating.

* * * * *

UNITED STATES PATENT AND TRADEMARK OFFICE

CERTIFICATE OF CORRECTION

PATENT NO. : 6,911,155 B2 Page 1 of 1
APPLICATION NO. : 10/061836
DATED : June 28, 2005
INVENTOR(S) : Michael D. Miller et al.

It is certified that error appears in the above-identified patent and that said Letters Patent is hereby corrected as shown below:

On the Title page, in Item (75), in “Inventors”, in column 1, line 1, delete “Pnilomath,” and insert -- Philomath, --, therefor.

On the Title page, in Item (75), in “Inventors”, in column 1, line 2, delete “Corvalis,” and insert -- Corvallis, --, therefor.

On the Title page, in Item (57), under “Abstract”, in column 2, line 10, after “50” insert -- percent --.

In column 9, line 41, in Claim 7, after “less” insert -- than --.

Signed and Sealed this

Fourth Day of August, 2009

JOHN DOLL

*Acting Director of the United States Patent and Trademark Office*